(12) United States Patent
Guo et al.

(10) Patent No.: US 9,063,204 B2
(45) Date of Patent: Jun. 23, 2015

(54) INCREASING THE PERFUSION SIGNAL TO NOISE RATIO (SNR) IN VELOCITY SELECTIVE ARTERIAL SPIN LABELING (VSASL) IN MAGNETIC RESONANCE IMAGING

(75) Inventors: Jia Guo, La Jolla, CA (US); Eric C. Wong, Del Mar, CA (US)

(73) Assignee: The Regents of the University of California, Oakland, CA (US)

( * ) Notice: Subject to any disclaimer, the term of this patent is extended or adjusted under 35 U.S.C. 154(b) by 559 days.

(21) Appl. No.: 13/452,518

(22) Filed: Apr. 20, 2012

(65) Prior Publication Data

US 2012/0268126 A1   Oct. 25, 2012

Related U.S. Application Data

(60) Provisional application No. 61/478,385, filed on Apr. 22, 2011.

(51) Int. Cl.
*G01R 33/483* (2006.01)
*G01R 33/563* (2006.01)

(52) U.S. Cl.
CPC ...... *G01R 33/4838* (2013.01); *G01R 33/56366* (2013.01)

(58) Field of Classification Search
CPC .............. G01R 33/4838; G01R 33/56366
See application file for complete search history.

(56) References Cited

U.S. PATENT DOCUMENTS

| 6,271,665 | B1 | 8/2001 | Berr et al. | |
|---|---|---|---|---|
| 6,564,080 | B1 | 5/2003 | Kimura | |
| 7,545,141 | B2 * | 6/2009 | Kimura | 324/306 |
| 7,587,233 | B2 * | 9/2009 | Wong et al. | 600/419 |
| 8,195,274 | B2 | 6/2012 | Wong | |
| 2004/0030240 | A1 | 2/2004 | Kimura | |
| 2004/0044281 | A1 | 3/2004 | Jesberger et al. | |
| 2004/0162483 | A1 | 8/2004 | Kimura | |
| 2005/0277825 | A1 | 12/2005 | Wong et al. | |
| 2005/0277828 | A1 | 12/2005 | Alsop | |
| 2006/0100503 | A1 | 5/2006 | Takai et al. | |
| 2006/0161060 | A1 | 7/2006 | Pai | |
| 2006/0184007 | A1 | 8/2006 | Judd et al. | |
| 2007/0282193 | A1 | 12/2007 | Brown | |

(Continued)

FOREIGN PATENT DOCUMENTS

| JP | 2005-305151 A | 11/2005 |
|---|---|---|
| WO | 03/094725 A1 | 11/2003 |

(Continued)

OTHER PUBLICATIONS

Alsop, D.C., et al., "Reduced transit-time sensitivity in noninvasive magnetic resonance imaging of human cerebral blood flow," Journal of Cerebral Blood Flow and Metabolism, 16(6):1236-1249, Nov. 1996.

(Continued)

*Primary Examiner* — Dixomara Vargas
(74) *Attorney, Agent, or Firm* — Perkins Coie LLP

(57) ABSTRACT

Techniques, systems computer program products are disclosed increasing tagging efficiency in velocity selective arterial spin labeling using multiple velocity selective saturation modules. In one aspect, a magnetic resonance imaging method for tagging arterial blood includes using two or more velocity selective saturation (VSS) modules to tag arterial blood. The tagged arterial blood is imaged.

28 Claims, 9 Drawing Sheets

(56) References Cited

U.S. PATENT DOCUMENTS

| | | |
|---|---|---|
| 2008/0269595 A1 | 10/2008 | Wong |
| 2009/0088626 A1 | 4/2009 | Sutton et al. |
| 2010/0030062 A1* | 2/2010 | Bolar et al. .................. 600/419 |
| 2010/0240983 A1 | 9/2010 | Jung et al. |
| 2012/0271157 A1 | 10/2012 | Wong et al. |
| 2013/0096418 A1 | 4/2013 | Jung et al. |

FOREIGN PATENT DOCUMENTS

| | | |
|---|---|---|
| WO | 03/094728 A1 | 11/2003 |
| WO | 2010/108161 A2 | 9/2010 |
| WO | 2011/130581 A2 | 10/2011 |
| WO | 2012/145765 A2 | 10/2012 |

OTHER PUBLICATIONS

Brookes, M.J., et al, "Noninvasive measurement of arterial cerebral blood volume using look-locker EPI and arterial spin labeling," Magnetic Resonance in Medicine, 58(1):41-54, Jul. 2007.

Buxton, R.B., et al., "A general kinetic model for quantitative perfusion imaging with arterial spin labeling," Magnetic Resonance in Medicine, 40(3):383-396, Sep. 1998.

Dai, W., et al., "Continuous Flow-Driven Inversion for Arterial Spin Labeling Using Pulsed Radio Frequency and Gradient Fields," Magnetic Resonance in Medicine, 60(6):1488-1497, Dec. 2008.

Davies, N.P., et al., "Selective arterial spin labeling (SASL): perfusion territory mapping of selected feeding arteries tagged using two-dimensional radiofrequency pulses," Magnetic Resonance in Medicine, 49(6):1133-1142, Jun. 2003.

Detre, J.A., et al., "Perfusion imaging," Magnetic Resonance in Medicine, 23(1):37-45, Jan. 1992.

Detre, J.A., et al., "Noninvasive Perfusion MR Imaging Using Spin Labeling Arterial Water," Chapter 15, Part V in Diffusion and Perfusion: Magnetic Resonance Imaging: Applications to Functional MRI (D. Le Bihan, Ed.), p. 296-305, Raven Press, New York, 1995.

Dixon, W.T., et al., "Projection angiograms of blood labeled by adiabatic fast passage," Magnetic Resonance in Medicine, 3(3):454-462, Jun. 1986.

Duyn, J.H., et al., "Simple correction method for k-space trajectory deviations in MRI," Journal of Magnetic Resonance, 132(1):150-153, May 1998.

Edelman, R.R. et al "Qualitative mapping of cerebral blood flow and functional localization with echo-planar MR imaging and signal targeting with alternating radio frequency," Radiology, 192(2):513-520, Aug. 1994.

Garcia, D.M., et al., "Pseudo-continuous flow driven adiabatic inversion for arterial spin labeling," Proceedings 13th Scientific Meeting, International Society for Magnetic Resonance in Medicine, p. 37, (2005).

Garwood, M., et al., "Advances in Magnetic Resonance—The Return of the Frequency Sweep: Designing Adiabatic Pulses for Contemporary NMR," Journal of Magnetic Resonance, 153(2):155-177, Dec. 2001.

Garwood, M., et al., "Symmetric Pulses to Induce Arbitrary Flip Angles with Compensation for RF Inhomogeneity and Resonance Offsets," Journal of Magnetic Resonance, 94(3):511-525, Oct. 1991.

Gunther, M., "Efficient visualization of vascular territories in the human brain by cycled arterial spin labeling MRI," Magnetic Resonance in Medicine, 56(3):671-675, Sep. 2006.

Gunther, M., et al. "Single-shot 3D imaging techniques improve arterial spin labeling perfusion measurements," Magnetic Resonance in Medicine, 54(2):491-498, Aug. 2005.

Guo, J., et al., "Imaging of Oxygen Extraction Fraction Using Velocity Selective Excitation with Arterial Nulling (VSEAN)," Proceedings of the International Society for Magnetic Resonance in Medicine,18:4057, (2010).

Hendrikse, J., "Flow territory mapping of the cerebral arteries with regional perfusion MRI," Stroke, 35(4):882-887, Apr. 2004.

Hennig, et al., "Hyperechoes," Magnetic Resonance in Medicine, 46(1):6-12, Jul. 2001.

International Search Report and Written Opinion mailed on Dec. 21, 2011 for International Application No. PCT/US2011/032591, filed Apr. 14, 2011 (7 pages).

International Search Report and Written Opinion mailed on Nov. 30, 2012 for International Application No. PCT/US2012/034537, filed Apr. 20, 2012 (6 pages).

International Search Report and Written Opinion mailed on Nov. 30, 2012 for International Application No. PCT/US2012/034720, filed Apr. 23, 2012 (6 pages).

International Search Report and Written Opinion mailed on Oct. 22, 2010 for International Application No. PCT/US2010/028068, filed Mar. 19, 2010 (7 pages).

International Search Report and Written Opinion mailed on Sep. 15, 2003 for International Application No. PCT/US03/14978, filed May 13, 2003 (3 pages).

Jung, Y., et al., "Multi-phase pseudo-continuous arterial spin labeling (MP PCASL): Robust PCASL method for CBF quantification," Proceedings 17th Scientific Meeting, International Society for Magnetic Resonance in Medicine, p. 622, (2009).

Jung, Y., et al., "Multiphase pseudocontinuous arterial spin labeling (MP-PCASL) for robust quantification of cerebral blood flow," Magnetic Resonance in Medicine, 64(3):799-810, Sep. 2010.

Jung, Y., et al., "Pseudo-continuous arterial spin labeling with optimized tagging efficiency for quantitative ASL fMRI," Proceedings 17th Scientific Meeting, International Society for Magnetic Resonance in Medicine, p. 1578, (2009).

Kim, S.G., "Quantification of relative cerebral blood flow change by flow-sensitive alternating inversion recovery (FAIR) technique: Application to functional mapping," Magnetic Resonance in Medicine, 34(3):293-301, Sep. 1995.

Kim, S.G., et al., "Perfusion imaging by a flow-sensitive alternating inversion recovery (FAIR) technique: Application to functional brain imaging," Magnetic Resonance in Medicine, 37(3):425-435, Mar. 1997.

Kwong, K.K. et al., "Perfusion MR imaging," Proceedings of the Society of Magnetic Resonance, vol. 2, Second Meeting, Aug. 6-12, 1994, San Francisco, California, p. 1005.

Lagarias, J.C., et al., "Convergence properties of the nelder-mead simplex method in low dimensions," SIAM Journal on Optimization, 9(1):112-147, (1998).

Liu, T.T., et al., "A signal processing model for arterial spin labeling functional MRI," NeuroImage, 24(1):207-215, Jan. 2005.

Lu, K, et al., "Regional white matter perfusion measurement using an optimized pseudo-continuous ASL MRI," Proceedings 17th Scientific Meeting, International Society for Magnetic Resonance in Medicine, p. 1521, (2009).

Luh, W.M., et al, "Pseudo-continuous Arterial Spin Labeling at 7T," Proceedings 16th Scientific Meeting, International Society for Magnetic Resonance in Medicine, p. 3339, (2008).

Luh, W.M., et al., "QUIPSS II with thin-slice T1 Periodic Saturation: A Method for Improving Accuracy of Quantitative Perfusion Imaging Using Pulsed Arterial Spin Labeling," Magnetic Resonance in Medicine, 41(6):1246-1254, Jun. 1999.

Mildner, T., et al., "Continuous arterial spin labeling at the human common carotid artery: the influence of transit times," NMR in Biomedicine, 18(1):19-23, Feb. 2005.

Norris, D.G., et al., "Velocity Selective Radiofrequency Pulse Trains", Journal of Magnetic Resonance, 137 (1):231-236, Mar. 1999.

Paley, R.E.A.C., "On Orthogonal Matrices," Journal of Mathematics and Physics, 12:311-320, (1932-1933).

Parry, A. & P.M. Matthews, "Functional magnetic resonance imaging (fMRI): A 'window' into the brain," Oxford University, Centre for Functional Magnetic Resonance Imaging of the Brain (2002), 42 pages, Web site: http://www.fmrib.ox.ac.uk/fmri_intro/fmri_intro.htm [originally accessed on Aug. 20, 2003].

Sutton, B.P., et al., "Fast, iterative image reconstruction for MRI in the presence of field inhomogeneities," IEEE Transactions on Medical Imaging, 22(2):178-188, Feb. 2003.

Trampel, R., et al., "Efficiency of Flow-Driven Adiabatic Spin Inversion Under Realistic Experimental Conditions: A Computer Simulation," Magnetic Resonance in Medicine, 51(6):1187-1193, Jun. 2004.

(56) References Cited

OTHER PUBLICATIONS

Van Gelderen, P., et al., "Pittfalls of MRI measurement of white matter perfusion based on arterial spin labeling," Magnetic Resonance in Medicine, 59(4):788-795, Apr. 2008.

Wang, J., et al., "Amplitude-modulated continuous arterial spin-labeling 3.0-T perfusion MR imaging with a single coil: feasibility study," Radiology, 235(1):218-228, Apr. 2005.

Werner, R., et al., "Continuous artery-selective spin labeling (CASSL)," Magnetic Resonance in Medicine, 53 (5):1006-1012, May 2005.

Williams, D.S., et al., "Magnetic resonance imaging of perfusion using spin inversion of arterial water," Proceedings of the National Academy of Sciences of the United States of America, 89(1):212-216, Jan. 1992.

Wong, E.C., "Vessel-encoded arterial spin-labeling using pseudocontinuous tagging," Magnetic Resonance in Medicine, 58(6):1086-1091, Dec. 2007.

Wong, E.C., "Vessel Encoded Arterial Spin Labeling Using Pseudo-Continuous Tagging," Proceedings of the International Society for Magnetic Resonance in Medicine, 14:668, (2006).

Wong, E.C., et al., "Blind detection of vascular sources and territories using random vessel encoded arterial spin labeling," Magnetic Resonance Materials in Physics, Biology and Medicine, 25(2):95-101, Apr. 2012.

Wong, E.C., et al., "Implementation of quantitative perfusion imaging techniques for functional brain mapping using pulsed arterial spin labeling," NMR in Biomedicine, 10(4-5):237-249, Jun.-Aug. 1997.

Wong, E.C., et al., "Quantitative imaging of perfusion using a single subtraction (QUIPSS and QUIPSS II)," Magnetic Resonance in Medicine, 39(5):702-708, May 1998.

Wong, E.C., et al., "Velocity-selective arterial spin labeling," Magnetic Resonance in Medicine, 55(6):1334-1341, Jun. 2006.

Wong, E.C., et al., "Velocity Selective Arterial Spin Labeling using an Adiabatic Hyperecho Pulse Train," Proceedings of the International Society for Magnetic Resonance in Medicine, 11:2181, (2003).

Wong, E.C., et al., "Velocity Selective Arterial Spin Labeling," Proceedings of the International Society for Magnetic Resonance in Medicine,10:621, (2002).

Wu, W.C., et al., "A theoretical and experimental investigation of the tagging efficiency of pseudocontinuous arterial spin labeling," Magnetic Resonance in Medicine, 58(5):1020-1027, Nov. 2007.

Wu, W.C., et al., "The Effects of Flow Dispersion and Cardiac Pulsation in Arterial Spin Labeling," IEEE Transactions on Medical Imaging, 26(1):84-92, Jan. 2007.

Zaharchuk, G. et al., "Multislice perfusion and perfusion territory imaging in humans with separate label and image coils," Magnetic Resonance in Medicine, 41(6):1093-1098, Jun. 1999.

Zimine, I., et al., "Dual vessel arterial spin labeling scheme for regional perfusion imaging," Magnetic Resonance in Medicine, 56(5):1140-1144, Nov. 2006.

\* cited by examiner

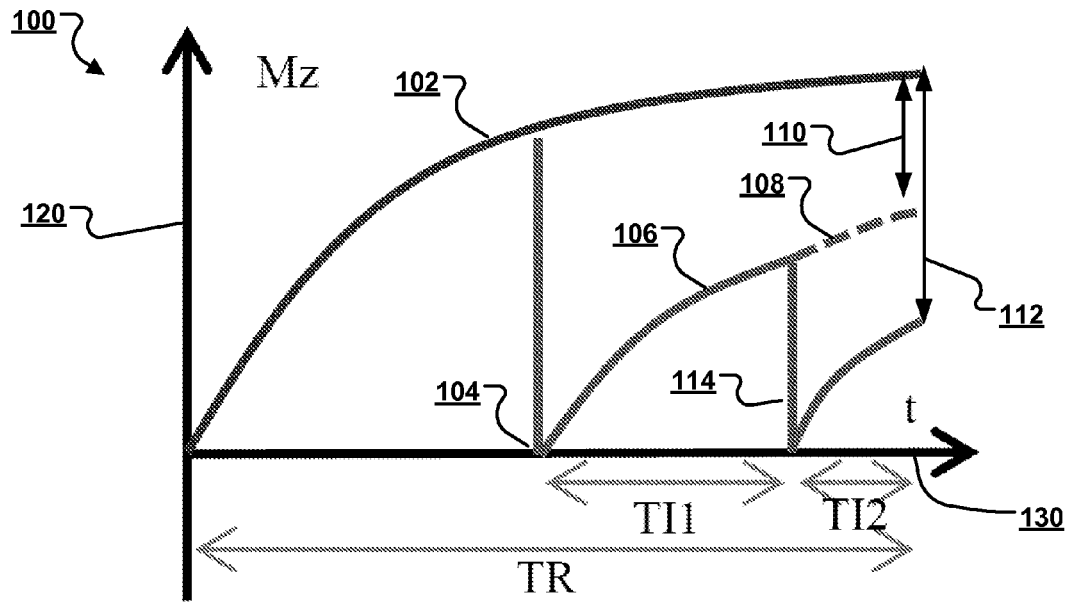
FIG. 1 Mz evolution with 2 VS pulses
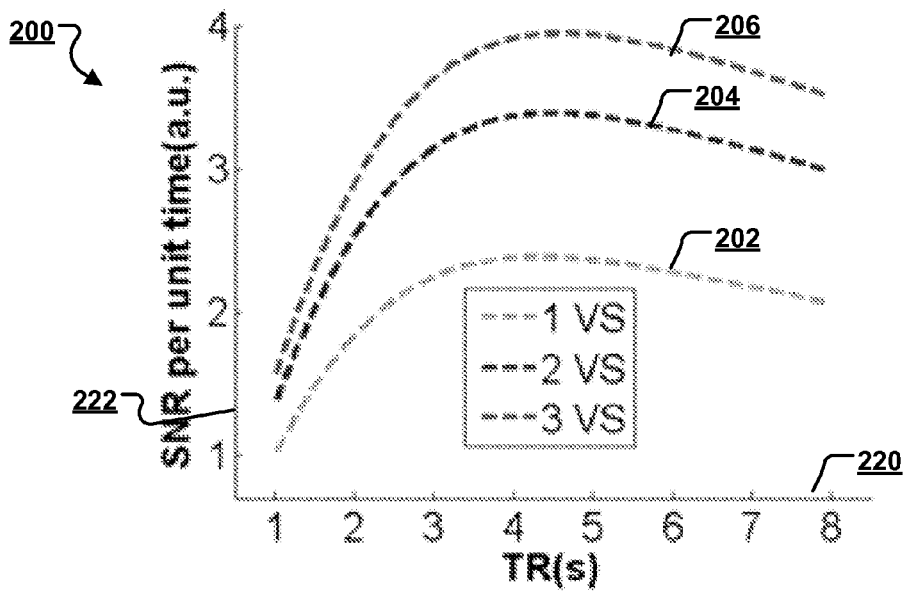
FIG. 2 Theoretical SNR per unit time vs. TR

US 9,063,204 B2

INCREASING THE PERFUSION SIGNAL TO NOISE RATIO (SNR) IN VELOCITY SELECTIVE ARTERIAL SPIN LABELING (VSASL) IN MAGNETIC RESONANCE IMAGING

CROSS-REFERENCE TO RELATED PATENT APPLICATIONS

This patent document claims the benefit of priority from U.S. Provisional Patent Application No. 61/478,385, entitled "INCREASING THE PERFUSION SIGNAL TO NOISE RATIO (SNR) IN VELOCITY SELECTIVE ARTERIAL SPIN LABELING (VSASL) IN MAGNETIC RESONANCE IMAGING," filed on Apr. 22, 2011, which is incorporated by reference in its entirety in the present patent document.

STATEMENT REGARDING FEDERALLY SPONSORED RESEARCH OR DEVELOPMENT

This invention was made with government support under grant no. RO1 EB002096 awarded by the National Institute of Health. The government has certain rights in the invention.

BACKGROUND

This application relates to magnetic resonance imaging (MRI). Imaging through MRI techniques is well known and has been widely applied in imaging applications in medical, biological and other fields. In essence, a typical MRI technique produces an image of a selected body part of an object under examination by manipulating the magnetic spins in a body part and processing measured responses from the magnetic spins. A MRI system may include hardware to generate different magnetic fields for imaging, including a static magnetic field along a z-direction to polarize the magnetic spins, gradient fields along mutually orthogonal x, y, or z directions to spatially select a body part for imaging, and an RF magnetic field to manipulate the spins.

MRI techniques may be used to capture the functional changes in body parts or tissues such as the brain perfusion. One commonly-used technique for functional MRI is in vivo imaging by arterial spin labeling (ASL), where the arterial blood is tagged by magnetic inversion using RF pulses applied to a plane or slab of arterial blood proximal to the tissue of interest. Images are typically acquired with and without prior tagging of arterial blood and are subtracted to produce images that are proportional to perfusion. This magnetic tagging allows for the imaging of blood flow without the administration of dyes or other imaging agents. Hence, ASL provides non-invasive tagging in MRI measurements.

SUMMARY

Techniques, systems and apparatus are disclosed for non-invasive mapping of perfusion territories using MRI.

The subject matter described in this specification potentially can provide one or more of the following advantages associated with vessel encoded ASL imaging. For example, the described techniques can provide for MR imaging of perfusion using VSASL with higher SNR, resulting in shorter scan times and/or higher resolution. For example, the improvement of tagging efficiency by using two VSS can result in an increase of SNR by approximately 20% when compared to one VSS module.

The subject matter described in this specification can also be implemented as a system including a processor and a memory coupled to the processor. The memory may encode one or more programs that cause the processor to perform one or more of the method acts described in this specification. Further the subject matter described in this specification can be implemented using various MRI machines.

In one exemplary aspect, a disclosed method for improving tagging efficiency of an image captured during magnetic resonance imaging of a subject by applying multiple radio frequency (RF) pulses includes applying a radio frequency (RF) signal to the subject, causing the subject to enter a magnetic saturation state, applying a first Velocity Selective (VS) pulse module to the subject at a first time during a time period in which the subject magnetically relaxes from the magnetic saturation state toward a magnetic equilibrium state, wherein the first VS pulse module includes at least one gradient pulse and at least one RF pulse, applying a second VS pulse module to the subject at a second time that is a predetermined time interval after the first time, causing the subject to magnetically re-saturate, wherein the second VS pulse module includes at least one gradient pulse and at least one RF pulse; and collecting imaging data at a third time after the application of the first VS pulse module and the second VS pulse module.

BRIEF DESCRIPTION OF THE DRAWINGS

FIG. 1 shows Mz evolution with 2 VS pulses.
FIG. 2 shows theoretical SNR per unit time vs. TR.

DETAILED DESCRIPTION

Figure 3A:
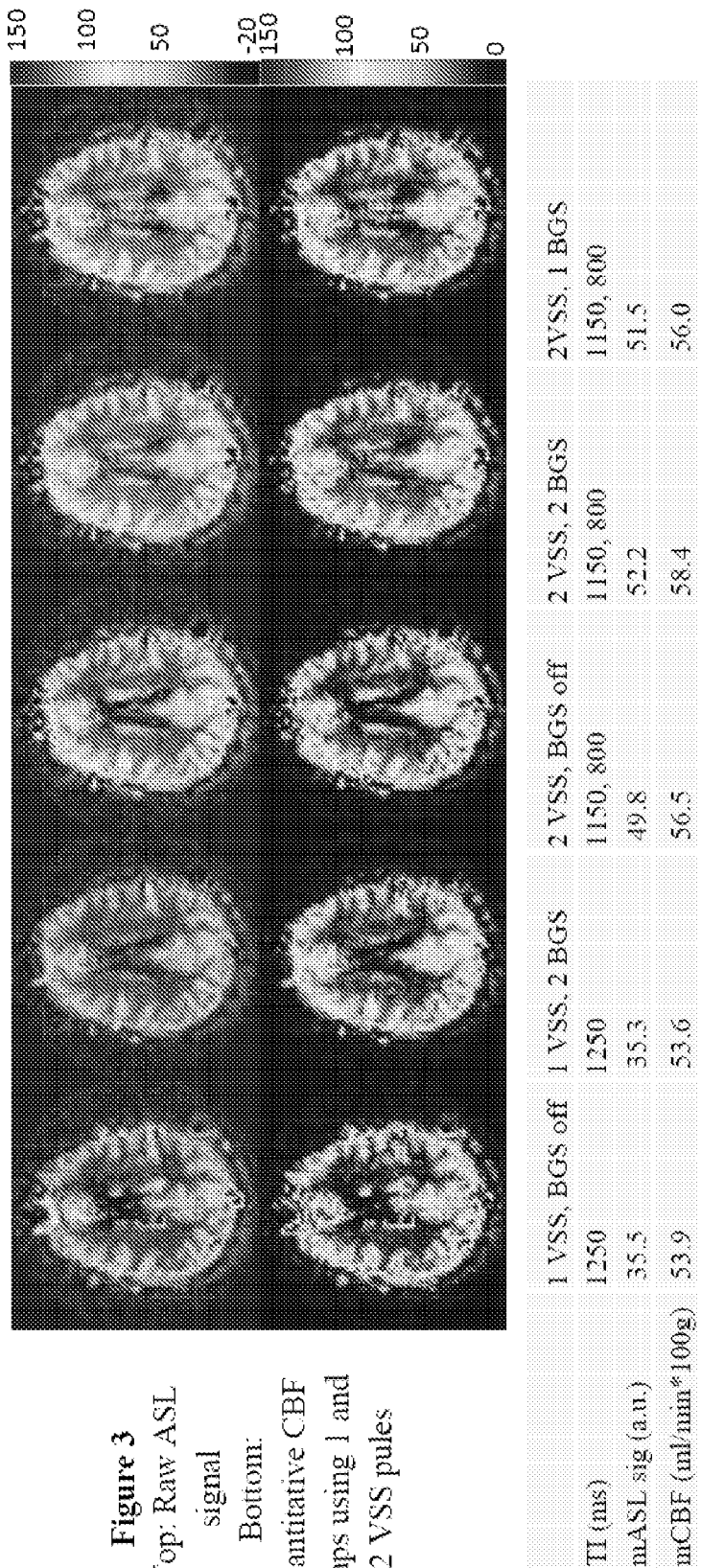
FIG. 3A shows raw ASL signal (top) and quantitative CBF maps using 1 and 2 VSS pulses (bottom).

The techniques and systems described in this application can enable non-invasive mapping of perfusion territories using magnetic resonance imaging (MRI). In particular, a person can be placed in an MRI scanner, and without the use of any exogenous agents, map the tissue regions of the person that are supplied with blood from different feeding arteries.

Some of the disclosed implementations are within a class of MRI methods known as arterial spin labeling (ASL). There are pulsed ASL methods that tag the magnetization of arterial blood using short radiofrequency pulses, and continuous ASL methods that tag arterial blood using long trains of RF pulses and flow driven adiabatic inversion. Each of these classes of ASL methods includes sub-classes that allow for the tagging process to be selective for specific arteries.

In velocity selective arterial spin labeling (VSASL), arterial blood is tagged by velocity selective saturation (VSS). This method is intrinsically insensitive to transit delays and may be useful in applications where transit delay can be long, such as perfusion imaging in white matter, and in stroke. However, VSASL that saturates, rather than inverts, arterial blood can cause relatively low tagging efficiency. To improving tagging efficiency, a tagging strategy is described that uses two or more VSS modules to improve the tagging efficiency and hence the SNR of VSASL. In some implementations, the application of pulses may be performed as a "pulse module." A pulse module may be a combination of RF pulses and gradient pulses. For example, in some implementations, a pulse module includes multiple VS pulses with gradient pulses in between.

The ideal ASL experiment is one in which the tagging is: 1) continuously 2) inverting blood and 3) occurring right at the arterioles before the blood enters the capillary bed and tissue. In conventional VSASL, the tagging is applied once before imaging, and the tagged blood undergoes uniform T1 decay prior to image acquisition. We note here that if two or more VSS modules are used, some of the tagged blood will be closer to saturation at the time of image acquisition, and the overall tagging efficiency can be improved.

To illustrate this method, the evolution of the Mz (representing magnetization along z or longitudinal axis) of blood is shown schematically in FIG. 1 for the case using 2 VSS pulses. The graph 100 depicts Mz subject magnetization along the vertical axis 120 as a function of time along the horizontal axis 130. The curve 102 represents blood (moving portion) in the control condition, in which the blood is in a saturation condition at the start of the axis due to the application of an RF pulse, and is relaxing toward an equilibrium condition. At time 104, while the blood magnetization is transitioning toward equilibrium state, a first VS pulse module is applied. The curve 106 shows that due to the application of the VS pulse module, the blood is in a tag condition and re-saturates. The dashed line 108 represents blood that is delivered to tissue (e.g. its velocity decelerates to below a cut-off velocity $v_{cut}$ before the later VSS pulses, e.g., 114, are applied). The total ASL signal is described by:

$$M_{Z,ASL} = M_{0B} \text{CBF}[(1-e^{-(TR-TI_1-TI_2)/T_{1B}})TI_1 e^{-(TI_1+TI_2)/T_{1B}} + (1-e^{-(TR-TI_1-TI_2)/T_{1B}})TI_2 e^{-TI_2/T_{1B}}] \quad \text{Equation (1)}$$

The magnetization strength 110 represents tagging efficiency (e.g., magnetization strength) if the later pulse 114 is not applied and the magnetization strength 112 represents the tagging efficiency that has increased (compared to 110) due to the application of a second VS pulse module at time 114. In graph 100, the time period TR may represent a period of repetition of the application of the above described pulse modules. The time intervals TI1 and TI2, which represent a duration between the application of the first VS pulse module and the second VS pulse module and the application of the second VS pulse module and the image collection, may be pre-determined based on the T1 parameter of the subject (e.g., human blood). In this aspect, the axis 130 in FIG. 1 is drawn to scale, with TR typically in the 4 to 5 second range. The values TI1 and TI2 may be pre-calculated and optimized to maximize the magnetization amplitude 112 that is used for collecting the image scan.

It will be appreciated that the first (or the second) VS pulse modules are applied at times 104, 114 prior to the magnetization of the subject reaching the equilibrium state. One reason being that, if the magnetization truly reaches it's equilibrium state, then the effect of the original pulse module is erased, and the tag is lost. Thus, all ASL MRI methods there is a fundamental tradeoff between reducing delay times between the tagging module and image acquisition to reduce relaxation effects, and extending delay times to increase the amount of tagged blood delivered to the target tissues.

In one operational scenario, the time line and magnetization graphs depicted in FIG. 1 may represent a brain MRI procedure as follows. Initially, the blood may be tagged in a tagging plane by applying a saturation pulse to an area proximate to the brain (e.g., artery in the neck). During the time the blood is magnetically relaxing (e.g., along the curve 102) the blood may enter capillaries and may be delivered to perfusion territories. As a result, the velocity of the blood may slow down. The second VS pulse modules may be applied such that a significant amount of blood is still above a cutoff frequency for the VS pulse, so that the VS pulses can effectively magnetically saturate the blood upon application. As can be appreciated, the application of the second pulse, with the blood in capillaries, may, in one aspect, improve the resolution and quality of subsequent MRI images taken from the subject.

Figure 8:
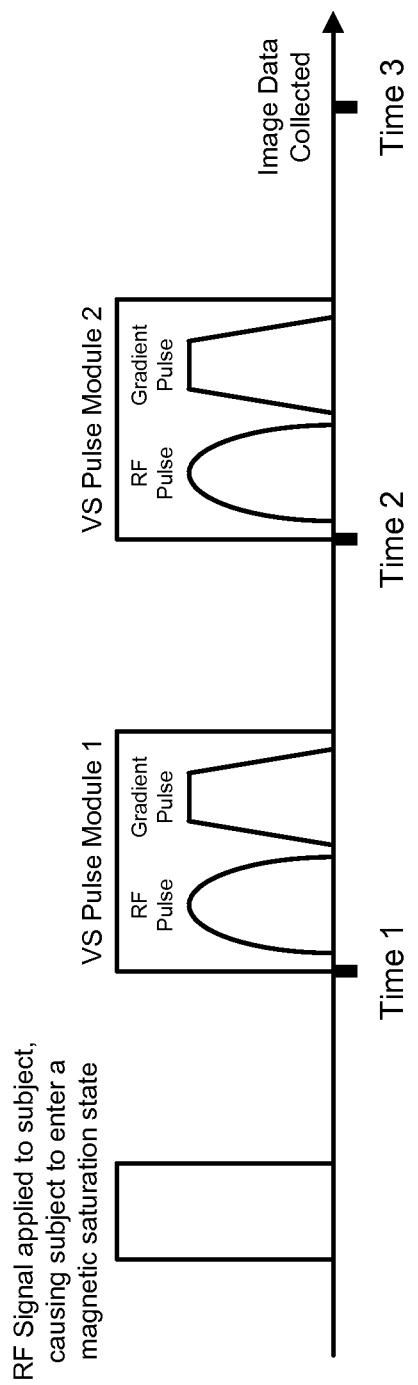
FIG. 8 shows an example of a pulse sequence chart.
Like reference symbols and designations in the various drawings indicate like elements.

FIG. 8 shows an example of a pulse sequence chart of the disclosed technology.

A good metric of the temporal efficiency in ASL experiment is the SNR per unit time, defined by signal/sqrt(TR). The theoretical SNR per unit time vs. TR was simulated using 1, 2 and 3 VSS modules and is shown in graph 200 depicted in FIG. 2, with the numbers normalized to the single VSS module with TR=1 s. In FIG. 2, the horizontal axis 220 represents units of TR time and the vertical axis 222 represents the SNR per unit time. The image acquisition time, as well as T2 decay during the VSS pulses, were neglected in this simulation, and a global saturation was assumed at the end the imaging acquisition. The theoretical SNR per unit time peaks around TR=4.3/4.5/4.6 s for 1/2/3 VSS modules, and the ratio is 1.00:1.42:1.65 with TI: [1.35 s], [0.85 s, 1.25 s], [0.6 s, 1.15 s, 0.6 s], as depicted by curves 202 (one VS pulse module), 204 (two VS pulse modules) and 206 (three VS pulse modules).

In one implementation, the imaging sequence was implemented using BIR4-based VSS modules and tested on healthy human volunteers on a GE 3T MR750 scanner. Other imaging parameters were: spatial spectral excitation, spin echo spiral, dual echo acquisition, TR=4.5 s with minimum TE1 and TE2 500 ms to correct for cerebro-spinal fluid (CSF) signal. Two global inversion pulses were applied after the VSS pulses for background suppression (BGS); except in one experiment, where the phase of the last portion of the BIR-4 was altered by 180° to tip down the static spins, and thereby replace one of the BGS pulses. Two reference scans were also collected to correct for the B1 sensitivity of the coil and to calculate the absolute $M_0$ of blood from the CSF signal. Raw ASL images were generated by pair-wise subtraction and CSF correction, and absolute CBF values were calculated using the equation above. In addition, the ASL signal was corrected for the small diffusion weighting (0.97 s/mm$^2$ per VSS module) that is present in the tag condition but not the control condition, assuming the ADC of gray matter.

The results are shown in images 300 in FIG. 3A, the imaging parameters and the averaged raw ASL signal and CBF values in the brain tissue were listed below the images 300. The theoretical raw ASL signal using two VSS pulses is 41.6% higher than using one VSS pulse using the parameters in this experiment, in a good agreement with the experimental results, 47.4% and 40.3% with and without using BGS.

The measured ASL signal was higher using 2 VSS modules, and was in good agreement with theory. This improvement makes VSASL SNR competitive with other ASL methods, while maintaining the inherent insensitivity to transit delays.

Figure 3B:
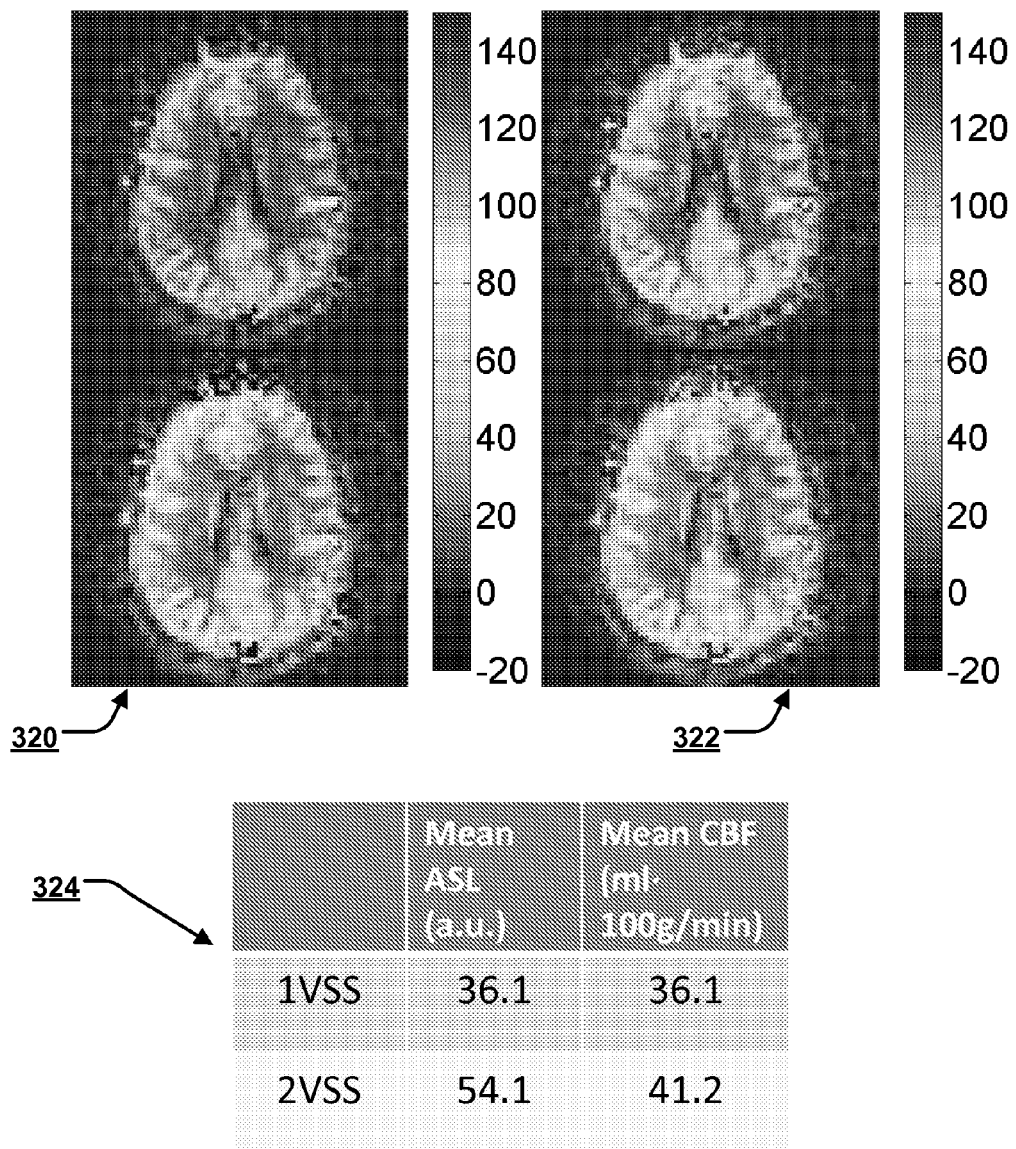
FIG. 3B depicts results obtained by performing MRI of a first subject.

FIG. 3B depicts results obtained by performing MRI on a first subject. Images 320 show raw ASL signals obtained using one VS pulse module (top) and two VS pulse modules (bottom) applied to the subject. Images 322 show the corresponding cerebral blood flow (CBF) for the 1 VS module case (top) and the 2 VS module case (bottom). Table 324 shows the corresponding results obtained for the 1 VS pulse module case and the two VS pulse module case. As can be seen, the mean ASL improves significantly, while the mean CBF values stay relatively the same.

Figure 3C:
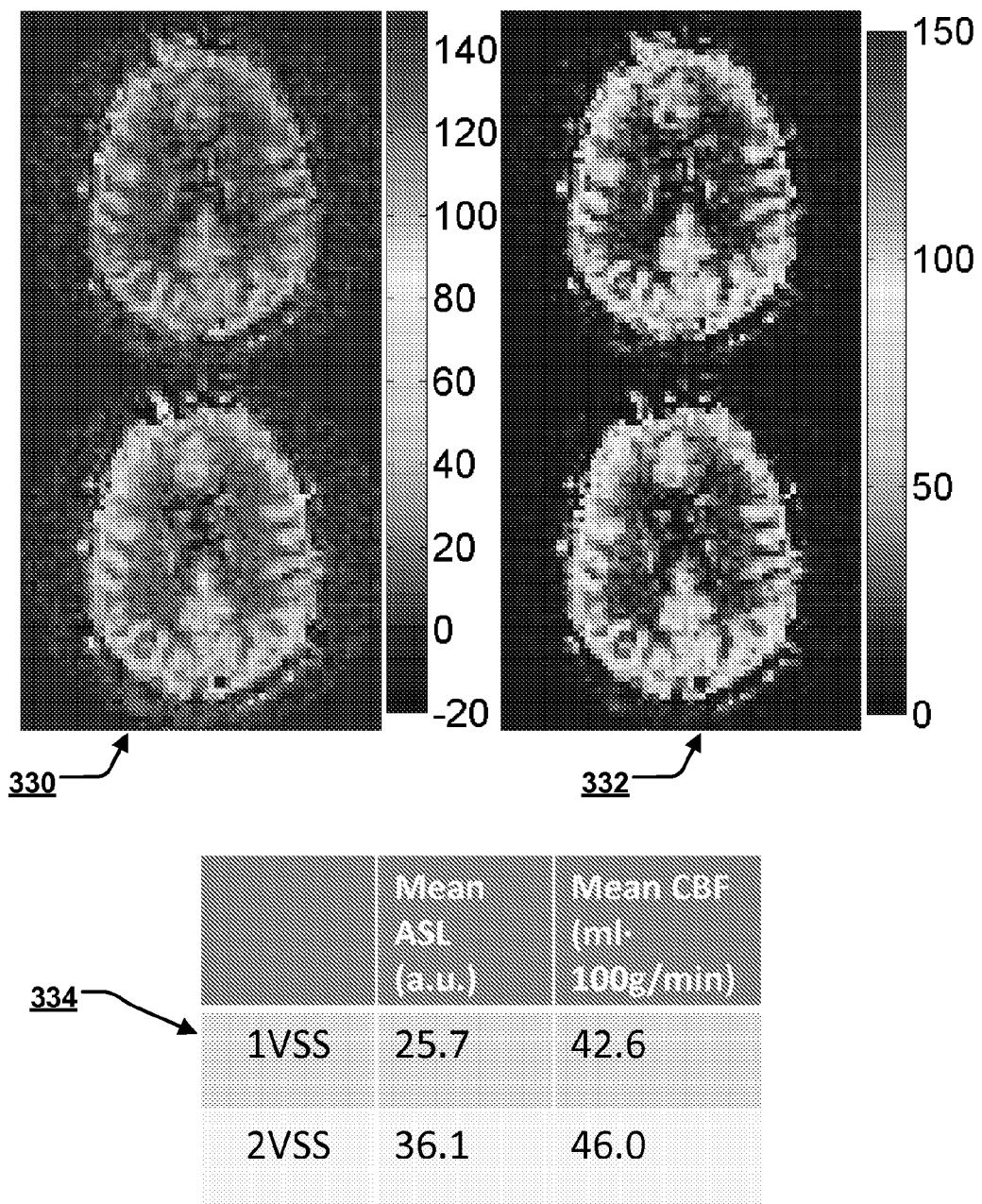
FIG. 3C depicts results obtained by performing MRI of a second subject.

FIG. 3C depicts results obtained by performing MRI on a first subject. Images 330 show raw ASL signals obtained using one VS pulse module (top) and two VS pulse modules (bottom) applied to the subject. Images 332 show the corresponding cerebral blood flow (CBF) for the 1 VS module case (top) and the 2 VS module case (bottom). Table 334 shows the corresponding results obtained for the 1 VS pulse module case and the two VS pulse module case. As can be seen, the mean ASL improves significantly, while the mean CBF values stay relatively the same.

From results shown in FIG. 3B and FIG. 3C above, it will be appreciated that the application of multiple VS pulse modules during MRI imaging allows for higher tagging efficiency (higher mean ASL values) while maintaining the CBF values relatively constant, thereby enabling high SNR imaging of the subject.

Figure 4:
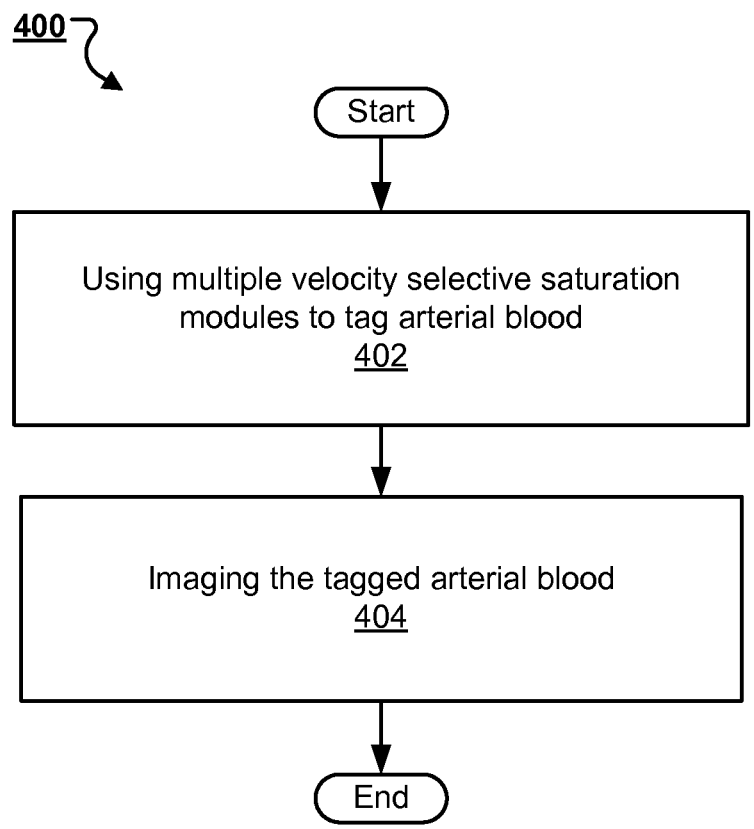
FIG. 4 is a process flow diagram of an exemplary process 400 for imaging of perfusion using VSASL with higher SNR to reduce scan time and include image resolution.

FIG. 4 is a process flow diagram of an exemplary process 400 for imaging of perfusion using VSASL with higher SNR to reduce scan time and include image resolution. The process 400 includes using multiple VSS modules to tag arterial blood perfusion (402). The tagged arterial blood perfusion is imaged. The details of using the multiple VSS modules are described above.

Figure 5:
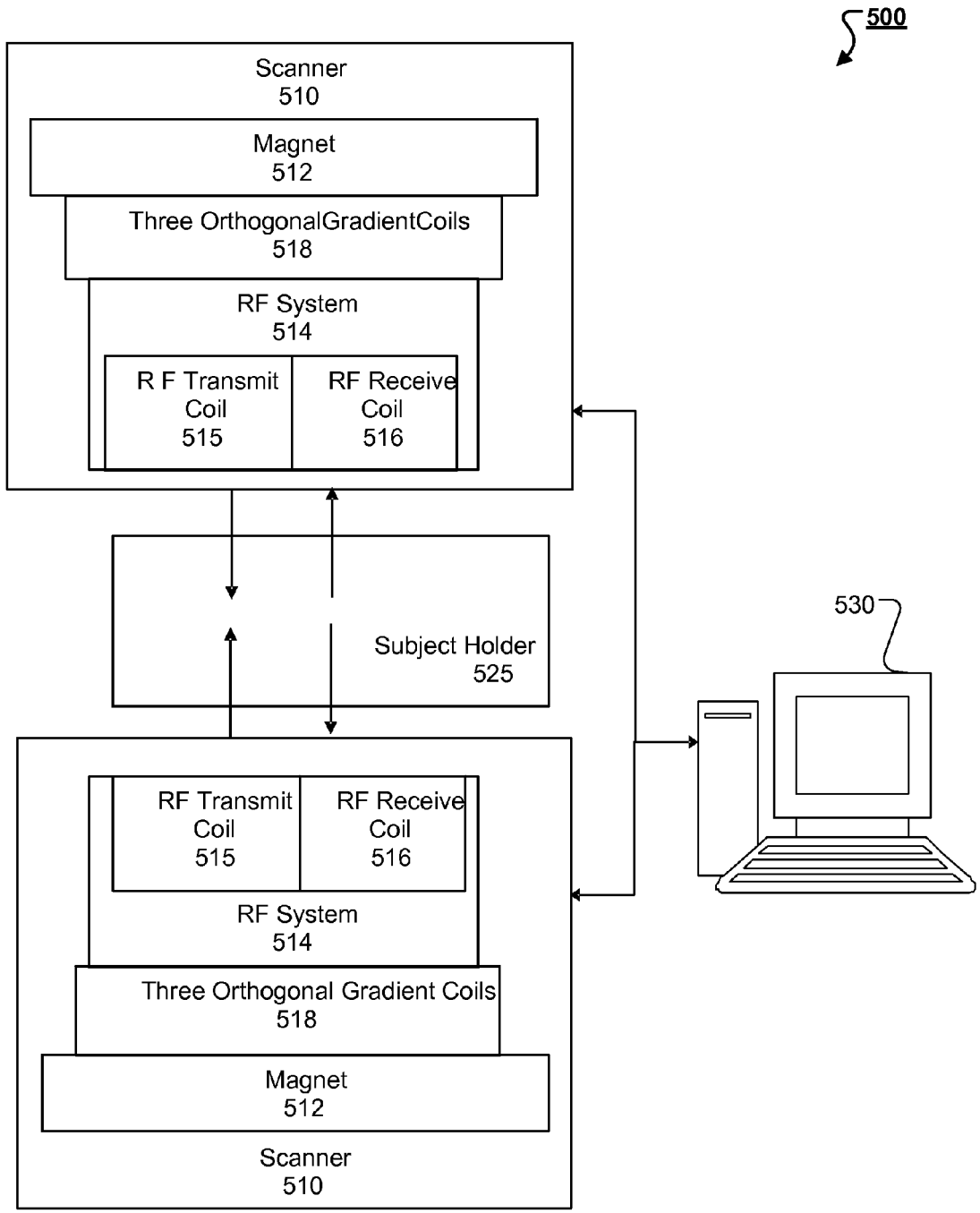
FIG. 5 shows an example MRI system 500.

FIG. 5 shows an example MRI system 500. Techniques as disclosed in this specification can be implemented using the MRI system 500. The MRI system 500 can be implemented using any one of various MRI scanners such as a GE 3T MR750 scanner (available from GE Healthcare Technologies, Milwaukee, Wis.) The MRI system 500 includes a scanner 510, a data processing apparatus 530 and a subject holder or table 525 for holding a subject 520. The scanner 510 includes a main magnet 512, three orthogonal gradient coils 518 and a RF system 514. The main magnet 512 is designed to provide a constant, homogeneous magnetic field. The three orthogonal gradient coils 518 are designed to provide three orthogonal, controller magnetic gradients used to acquire image data of a desired slice by generating an encoded and slice-selective magnetic field. The RF system 514 includes a RF transmit coil 515 and a RF receive coil designed to transmit and receive RF pulses. The RF system 545 can further include a RF synthesizer (not shown) and a power amplifier (not shown). In some implementations, an integrated transceiver coil (not shown) can be implemented instead of the separate transmit coil 515 and receive coil 516 for transmitting and receiving RF signals. For example, a close-fitting smaller coil can improve image quality when a small region is being imaged. Further, various types of coils that are placed around specific parts of a body (e.g., the head, knee, wrist, etc.) or even internally can be implemented depending on the sample and imaging applications.

The MRI system 500 is designed to perform the techniques disclosed in this specification. In particular, the MRI system 500 is designed to implement the methods disclosed with respect to FIG. 4. The RF system 514 is designed to apply to a target subject 520 a non-selective inversion RF pulse, a slice-selective inversion RF pulse and a half RF excitation pulse. The three orthogonal coils 518 are designed to apply slice-selective magnetic field gradients (of a first polarity and a second polarity) and magnetic readout gradients. The data processing apparatus (e.g., a computer) 530 is designed to receive and process the acquired data to obtain desired images corresponding to the short T2 components. For example, the data processing apparatus can perform the dual echo subtraction.

Figure 6:
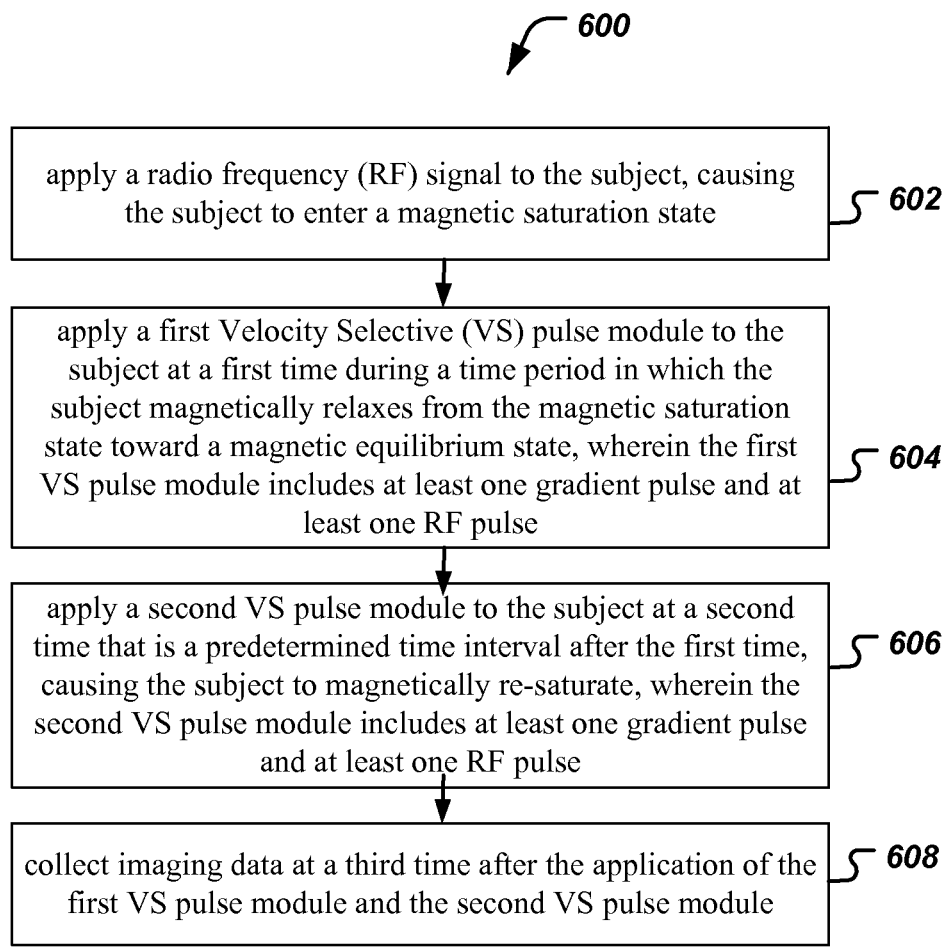
FIG. 6 is a flow chart representation of a process useful in magnetic resonance imaging.

FIG. 6 is a flow chart representation of a process 600 useful in magnetic resonance imaging. In some implementations, the process 600 may be used for improving tagging efficiency of an image captured during magnetic resonance imaging of a subject by applying multiple radio frequency (RF) pulses.

At 602, a radio frequency (RF) signal is applied to the subject, as previously described, causing the subject to enter a magnetic saturation state.

At 604, a first Velocity Selective (VS) pulse module is applied to the subject at a first time during a time period in which the subject magnetically relaxes from the magnetic saturation state toward a magnetic equilibrium state. The first VS pulse module may include at least one gradient pulse and at least one RF pulse. The effect of the first VS pulse module is discussed previously in this document, e.g., with respect to FIG. 1.

At 606, a second VS pulse module is applied to the subject at a second time that is a predetermined time interval after the first time, causing the subject to magnetically re-saturate, wherein the second VS pulse module includes at least one gradient pulse and at least one RF pulse. In some implementations, the pre-determined time interval is based on a subject characteristic. For example, as previously discussed, the periodic time interval may be the T1 relaxation time of moving portion of the subject. In some implementations, the second VS pulse module may be applied prior to an average velocity of a moving portion of the subject falling below a cutoff frequency. As previously discussed, when the moving portion (e.g., blood flowing through capillaries to a perfusion region) falls below the cutoff frequency, it may be insensitive to the application of RF pulses.

At 608, imaging data is collected at a third time after the application of the first VS pulse module and the second VS pulse module. In some implementations, the imaging data is collected using receive coils 516, previously described.

The process 600 may further include applying a third VS pulse module to the subject at a fourth time after the second time and before the third time, causing the subject to magnetically re-saturate. As previously discussed with respect to FIG. 2, the application of multiple VS pulse modules may successively improve the magnitude of the captured magnetization signals and therefore facilitate higher SNR readings of the subject.

In some implementations, the process 600 may include multiple repetitions of the above-discussed steps 602, 604, 606 and 608. MRI image data may be gathered after each iteration. The multiple MRI images, thus gathered over multiple iterations, may be processed to improve the quality of a final MRI image of the subject. As previously discussed with respect to FIG. 1, in one advantageous aspect, the application of the second VS pulse module may result in a collected imaging data that has magnetic signal strength higher than if no second VS pulse module were applied.

Figure 7:
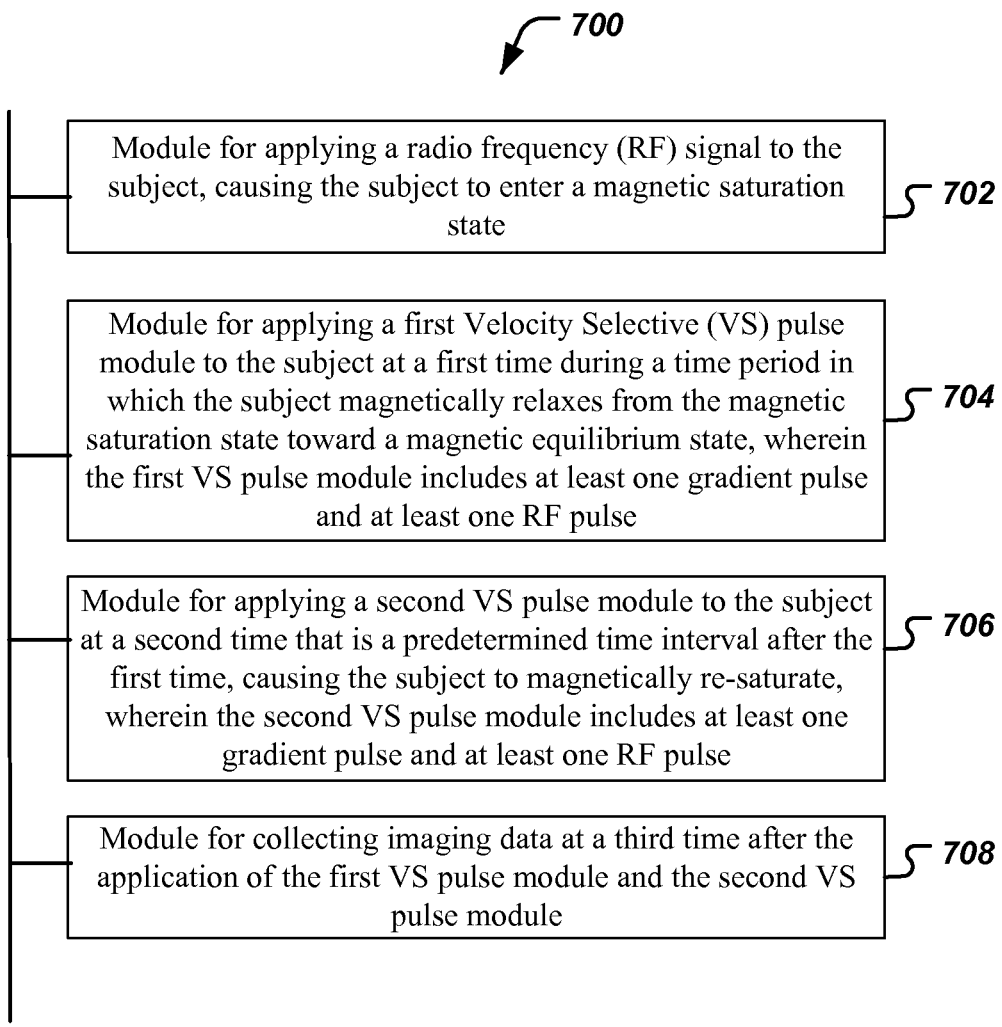
FIG. 7 is a block diagram representation of a portion of a magnetic resonance imaging apparatus.

FIG. 7 is a block diagram representation of a portion of a magnetic resonance imaging apparatus 700. The module 702 (e.g., RF transmitting coils) is for applying a radio frequency (RF) signal to the subject, causing the subject to enter a magnetic saturation state. The module 704 is for applying a first Velocity Selective (VS) pulse module to the subject at a first time during a time period in which the subject magnetically relaxes from the magnetic saturation state toward a magnetic equilibrium state, wherein the first VS pulse module includes at least one gradient pulse and at least one RF pulse. The module 706 is for applying a second VS pulse module to the subject at a second time that is a predetermined time interval after the first time, causing the subject to magnetically re-saturate, wherein the second VS pulse module includes at least one gradient pulse and at least one RF pulse. The module 708 is for collecting imaging data at a third time after the application of the first VS pulse module and the second VS pulse module. The apparatus 700 and modules 702, 704, 706, 708 may be further configured to implement some of the techniques disclosed in this document.

It will be appreciated that systems, methods and apparatus are disclosed for increasing tagging efficiency, which in turn may increase signal to noise ratio of collected signals, in a magnetic resonance imaging applications. In one aspect, after the initial application of a velocity sensitive pulse module, which may include one or more RF pulses with gradient pulses in between, one or more additional pulses are applied to the subject. In one advantageous aspect, the application of multiple pulses may cause the subject to magnetically saturate multiple times, thereby creating a greater difference between magnetization at equilibrium and magnetization when a reading is taken.

It will further be appreciated that the discussed techniques may be implemented in practice by using existing MRI machines (e.g., existing full body coils) by simply adjusting the timing of pulse application and the number of times the pulses are applied.

It will further be appreciated that the increased SNR in MRI that can be achieved using the disclosed techniques may be advantageously used in practice to reduce scan times (thus reducing a patient's exposure to RF emissions) or to obtain higher resolution MRI images.

Various implementations of the subject matter described herein may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications, or code) include machine instructions for a programmable processor, and may be implemented in a high-level procedural and/or object-oriented programming language, and/or in assembly/machine language. As used herein, the term "information carrier" comprises a "machine-readable medium" that includes any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal, as well as a propagated machine-readable signal. The term "machine-readable signal" refers to any signal used to provide machine instructions and/or data to a programmable processor.

To provide for interaction with a user, the subject matter described herein may be implemented on a computer having a display device (e.g., a CRT (cathode ray tube) or LCD (liquid crystal display) monitor) for displaying information to the user and a keyboard and a pointing device (e.g., a mouse or a trackball) by which the user may provide input to the computer. Other kinds of devices may be used to provide for interaction with a user as well; for example, feedback provided to the user may be any form of sensory feedback (e.g., visual feedback, auditory feedback, or tactile feedback); and input from the user may be received in any form, including acoustic, speech, or tactile input.

The subject matter described herein may be implemented in a computing system that includes a back-end component (e.g., as a data server), or that includes a middleware component (e.g., an application server), or that includes a front-end component (e.g., a client computer having a graphical user interface or a Web browser through which a user may interact with an implementation of the subject matter described herein), or any combination of such back-end, middleware, or front-end components. The components of the system may be interconnected by any form or medium of digital data communication (e.g., a communication network). Examples of communication networks include a local area network ("LAN"), a WAN, and the Internet.

The computing system may include clients and servers. A client and server are generally remote from each other and typically interact through a communication network. The relationship of client and server arises by virtue of computer programs running on the respective computers and having a client-server relationship to each other.

Only a few examples and implementations are disclosed. Variations, modifications, and enhancements to the described examples and implementations and other implementations can be made based on what is disclosed.

What is claimed is:

1. A method for improving tagging efficiency of an image captured during magnetic resonance imaging (MRI) of a subject by applying multiple radio frequency (RF) pulses, comprising:

applying, using an MRI system, a radio frequency (RF) signal to the subject, causing the subject to enter a magnetic saturation state;

applying, using the MRI system, a first Velocity Selective (VS) pulse module to the subject at a first time during a time period in which the subject magnetically relaxes from the magnetic saturation state toward a magnetic equilibrium state, wherein the first VS pulse module includes at least one gradient pulse and at least one RF pulse;

applying, using the MRI system, a second VS pulse module to the subject at a second time that is a predetermined time interval after the first time, causing the subject to magnetically re-saturate, wherein the second VS pulse module includes at least one gradient pulse and at least one RF pulse;

collecting, using the MRI system, imaging data at a third time after the application of the first VS pulse module and the second VS pulse module;

iterating, multiple times, using the MRI system, operations of the applying the RF signal, the applying the first VS pulse module, the applying the second VS pulse module and the collecting the imaging data; and processing, using a data processing apparatus, the imaging data collected during the iterations to generate a magnetic resonance image of the subject.

2. The method of claim 1, wherein the predetermined time interval is based on a characteristic of the subject.

3. The method of claim 2, wherein the characteristic of the subject includes a magnetic relaxation time T1 of the subject.

4. The method of claim 1, wherein the second VS pulse module is applied prior to an average velocity of a moving portion of the subject falling below a cutoff velocity.

5. The method of claim 1, further comprising:
applying, using the MRI system, a third VS pulse module to the subject at a fourth time after the second time and before the third time, causing the subject to magnetically re-saturate.

6. The method of claim 1 wherein a first magnetization signal strength of the collected imaging data is greater than a second magnetization signal strength, had the data been collected prior to the application of the second VS pulse module.

7. An apparatus for improving tagging efficiency of an image captured during magnetic resonance imaging of a subject by applying multiple velocity selective pulse modules, comprising:
a first set of coils;
a controller that operates the first set of coils to:
apply a radio frequency (RF) signal to the subject, causing the subject to enter a magnetic saturation state,
apply a first VS pulse module to the subject at a first time during a time period in which the subject magnetically relaxes from the magnetic saturation state toward a magnetic equilibrium state, and
apply a second VS pulse module to the subject at a second time that is a predetermined time interval after the first time, causing the subject to magnetically re-saturate;
a second set of coils that collects imaging data at a third time after the application of the first VS pulse module and the second VS pulse module,
wherein the controller is operable to control the first set of coils and the second set of coils to iterate, multiple times, operations of the applying the RF signal, the applying the first VS pulse module, the applying the second VS pulse module and the collecting the imaging data; and
a processor that processes the imaging data collected during the iterations to generate a magnetic resonance image of the subject.

8. The apparatus of claim 7, wherein the predetermined time interval is based on a characteristic of the subject.

9. The apparatus of claim 8, wherein the characteristic of the subject includes a magnetic relaxation time T1 of the subject.

10. The apparatus of claim 7, wherein the controller operates the first set of coils to apply the second VS pulse module prior to an average velocity of a moving portion of the subject falling below a cutoff velocity.

11. The apparatus of claim 7, wherein the controller further operates the first set of coils to apply a third VS pulse module to the subject at a fourth time after the second time and before the third time, causing the subject to magnetically re-saturate.

12. The apparatus of claim 7 wherein a first magnetization signal strength of the collected imaging data is greater than a second magnetization signal strength, had the data been collected prior to the application of the second VS pulse module.

13. The apparatus of claim 7 wherein the first set of coils and the second set of coils comprise a same set of full body coils.

14. A computer program product comprising a non-transitory, computer-readable medium having code stored thereon, the code, when executed by a processor, causing the processor to implement a method for improving tagging efficiency of an image captured during magnetic resonance imaging of a subject by applying multiple radio frequency (RF) pulses, the method comprising:
controlling application of a radio frequency (RF) signal to the subject, causing the subject to enter a magnetic saturation state;
controlling application of a first Velocity Selective (VS) pulse module to the subject at a first time during a time period in which the subject magnetically relaxes from the magnetic saturation state toward a magnetic equilibrium state, wherein the first VS pulse module includes at least one gradient pulse and at least one RF pulse;
controlling application of a second VS pulse module to the subject at a second time that is a predetermined time interval after the first time, causing the subject to magnetically re-saturate, wherein the second VS pulse module includes at least one gradient pulse and at least one RF pulse;
controlling collection of imaging data at a third time after the application of the first VS pulse module and the second VS pulse module;
controlling iterations, multiple times, of operations of the controlling the application of the RF signal, of the controlling the application of first VS pulse module, of the controlling the application of the second VS pulse module and the controlling the collection of the imaging data; and
controlling processing of the imaging data collected during the iterations to generate a magnetic resonance image of the subject.

15. The computer program product of claim 14, wherein the predetermined time interval is based on a characteristic of the subject.

16. The computer program product of claim 15, wherein the characteristic of the subject includes a magnetic relaxation time T1 of the subject.

17. The computer program product of claim 15, wherein the second VS pulse module is applied prior to an average velocity of a moving portion of the subject falling below a cutoff velocity.

18. A method for improving tagging efficiency of an image captured during magnetic resonance imaging (MRI) of a subject by applying multiple radio frequency (RF) pulses, comprising:
applying, using an MRI system, a radio frequency (RF) signal to the subject, causing the subject to enter a magnetic saturation state;
applying, using the MRI system, a first Velocity Selective (VS) pulse module to the subject at a first time during a time period in which the subject magnetically relaxes from the magnetic saturation state toward a magnetic equilibrium state, wherein the first VS pulse module includes at least one gradient pulse and at least one RF pulse;
applying, using the MRI system, a second VS pulse module to the subject at a second time that is a predetermined time interval after the first time, causing the subject to magnetically re-saturate, wherein the second VS pulse module includes at least one gradient pulse and at least one RF pulse; and
collecting, using the MRI system, imaging data at a third time after the application of the first VS pulse module and the second VS pulse module,
wherein a first magnetization signal strength of the collected imaging data is greater than a second magnetization signal strength, had the data been collected prior to the application of the second VS pulse module.

19. The method of claim 18, wherein the predetermined time interval is based on a characteristic of the subject including a magnetic relaxation time T1 of the subject.

20. The method of claim 18, wherein the second VS pulse module is applied prior to an average velocity of a moving portion of the subject falling below a cutoff velocity.

21. The method of claim 18, further comprising:
applying, using the MRI system, a third VS pulse module to the subject at a fourth time after the second time and before the third time, causing the subject to magnetically re-saturate.

22. The method of claim 18, further comprising:
iterating, multiple times, using the MRI system, operations of the applying the RF signal, the applying the first VS pulse module, the applying the second VS pulse module and the collecting the imaging data; and
processing, using a data processing apparatus, the imaging data collected during the iterations to generate a magnetic resonance image of the subject.

23. An apparatus for improving tagging efficiency of an image captured during magnetic resonance imaging of a subject by applying multiple velocity selective pulse modules, comprising:
a first set of coils;
a controller that operates the first set of coils to:
apply a radio frequency (RF) signal to the subject, causing the subject to enter a magnetic saturation state,
apply a first VS pulse module to the subject at a first time during a time period in which the subject magnetically relaxes from the magnetic saturation state toward a magnetic equilibrium state, and
apply a second VS pulse module to the subject at a second time that is a predetermined time interval after the first time, causing the subject to magnetically re-saturate; and
a second set of coils that collects imaging data at a third time after the application of the first VS pulse module and the second VS pulse module,
wherein a first magnetization signal strength of the collected imaging data is greater than a second magnetization signal strength, had the data been collected prior to the application of the second VS pulse module.

24. The apparatus of claim 23, wherein the predetermined time interval is based on a characteristic of the subject including a magnetic relaxation time T1 of the subject.

25. The apparatus of claim 23, wherein the controller operates the first set of coils to apply the second VS pulse module prior to an average velocity of a moving portion of the subject falling below a cutoff velocity.

26. The apparatus of claim 23, wherein the controller further operates the first set of coils to apply a third VS pulse module to the subject at a fourth time after the second time and before the third time, causing the subject to magnetically re-saturate.

27. The apparatus of claim 23, wherein the controller is operable to control the first set of coils and the second set of coils to iterate, multiple times, operations of the applying the RF signal, the applying the first VS pulse module, the applying the second VS pulse module and the collecting the imaging data; and, the apparatus further comprising:
a processor that processes the imaging data collected during the iterations to generate a magnetic resonance image of the subject.

28. The apparatus of claim 23, wherein the first set of coils and the second set of coils comprise a same set of full body coils.

* * * * *